(12) United States Patent
Lee et al.

(10) Patent No.: US 8,479,077 B2
(45) Date of Patent: *Jul. 2, 2013

(54) MEMORY DEVICE AND BIT ERROR DETECTION METHOD THEREOF

(75) Inventors: Shea-Yun Lee, Seoul (KR); Dong-Hyun Song, Yongsin-si (KR); Jang-Hwan Kim, Suwon-si (KR); Sang-Lyul Min, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1567 days.

This patent is subject to a terminal disclaimer.

(21) Appl. No.: 11/748,933

(22) Filed: May 15, 2007

(65) Prior Publication Data

US 2007/0226588 A1 Sep. 27, 2007

Related U.S. Application Data

(63) Continuation-in-part of application No. 11/582,106, filed on Oct. 17, 2006.

(30) Foreign Application Priority Data

Oct. 24, 2005 (KR) ................ 2005-100406

(51) Int. Cl.
*H03M 13/00* (2006.01)
(52) U.S. Cl.
USPC .......................... 714/758; 714/763
(58) Field of Classification Search
USPC ......................... 714/758, 763, 782
See application file for complete search history.

(56) References Cited

U.S. PATENT DOCUMENTS

| 4,403,303 | A | * | 9/1983 | Howes et al. ................ 703/27 |
| 5,867,509 | A | * | 2/1999 | Tanaka ......................... 714/758 |
| 6,233,717 | B1 | * | 5/2001 | Choi ............................. 714/805 |
| 6,836,869 | B1 | | 12/2004 | Wyland | |
| 7,607,025 | B1 | * | 10/2009 | Trimberger ................. 713/193 |
| 7,848,933 | B2 | * | 12/2010 | Michener .................... 704/500 |
| 2003/0182506 | A1 | * | 9/2003 | Kusumi ....................... 711/117 |
| 2005/0066251 | A1 | * | 3/2005 | Srivastava .................. 714/758 |
| 2007/0226588 | A1 | | 9/2007 | Lee et al. | |
| 2008/0005646 | A1 | | 1/2008 | Bains | |
| 2010/0049878 | A1 | * | 2/2010 | Yu et al. ...................... 710/11 |

FOREIGN PATENT DOCUMENTS

| KR | 1020040075557 | 8/2004 |
| KR | 1020050064887 | 6/2005 |

OTHER PUBLICATIONS

English Abstract for Publication No. 1020040075557.
English Abstract for Publication No. 1020050064887.

* cited by examiner

*Primary Examiner* — Guy Lamarre
(74) *Attorney, Agent, or Firm* — F. Chau & Associates, LLC (57) ABSTRACT

A memory device detects and correct bit errors. The memory device includes cyclic redundancy check (CRC) and error correction code (ECC) circuits. The CRC circuit generates a write CRC code corresponding to data to be stored in memory cells. The ECC circuit generates an ECC code corresponding to the data and detecting and correcting a bit error of the data by means of the ECC code during a read operation. The CRC circuit generates a read CRC code corresponding to data corrected by the ECC circuit during the read operation, and detects a bit error of the data according to a comparison of the read CRC code and the write CRC code.

20 Claims, 13 Drawing Sheets

MEMORY DEVICE AND BIT ERROR DETECTION METHOD THEREOF

CROSS-REFERENCE TO RELATED APPLICATIONS

This is a continuation-in-part application of U.S. patent application Ser. No. 11/582,106, filed Oct. 17, 2006, claiming priority under 35 U.S.C. §119 to Korean Patent Application 2005-100406 filed on Oct. 24, 2005, the entire contents of which are herein incorporated by reference.

BACKGROUND

1. Technical Field

The present disclosure relates to memory devices. In particular, the present disclosure relates to a memory device and method for detecting bit errors therein.

2. Discussion of Related Art

Memory devices are used for storing and retrieving data. Memory devices are largely classified into random access memories (RAMs) and read-only memories (ROMs). RAMs are volatile memory devices that lose their stored data when a power supply is turned off. ROMs are nonvolatile memory devices that retain data even without power supply. RAMs include dynamic RAMs and static RAMs. ROMs include programmable ROMs (PROMs), erasable PROMs (EPROMs), electrically EPROMs (EEPROMs), and flash memories.

The flash memories are widely employed in mobile communication terminals, portable media players, digital cameras, mobile storage media, and so forth. In using the flash memories for storage media, data integrity needs to be assured. However, data stored on the flash memory devices typically includes bit errors. With their inherent property as memory devices, the flash memories (or a flash memory system) need to have functions for detecting and correcting bit errors therein. Flash memories employ error correction code (ECC) circuits for detecting and correcting bit errors therein.

The ECC circuits used in the flash memory device. The ECC circuits are designed to correct m-bit errors (for example, 1-bit error) and to detect n-bit errors (for example, 2-bit errors). Any more than n-bit errors (for example, 2-bit errors) may not be detected in the flash memory. This limit on the number of detectable error bits degrades the reliability of the flash memory device.

SUMMARY OF THE INVENTION

The memory device corrects bit errors of a predetermined number, detecting pluralities of erroneous bits. According to an embodiment of the present invention, a memory device include a CRC circuit generating a write CRC code corresponding to data to be stored in memory cells; and an ECC circuit generating an ECC code corresponding to the data and detecting and correcting a bit error of the data by means of the ECC code during a read operation. The CRC circuit generates a read CRC code corresponding to data corrected by the ECC circuit during the read operation, and detects a bit error of the data according to a comparison of the read CRC code and the write CRC code.

The CRC circuit includes a CRC engine receiving the data corrected by the ECC circuit and generating the read CRC code, and a comparator generating the pass signal when the read CRC code matches the write CRC code, and generating the fail signal when the read CRC code does not match the write CRC code.

For example, the memory device is a NAND flash memory device. The NAND flash memory device includes a cell array divided into main and spare regions, and the data is programmed into the main region and the ECC and CRC codes are programmed into the spare region. The ECC circuit detects two error bits and corrects one error bit, and the CRC circuit detects more than two error bits.

According to an embodiment of the present invention, a memory device includes a CRC circuit generating a write CRC code corresponding to data to be stored in memory cells, a first ECC circuit generating a first ECC code corresponding to the data and detecting and correcting a bit error of the data by means of the first ECC code during a read operation, and a second ECC circuit generating a second ECC code corresponding to the write CRC data and detecting and correcting a bit error of the write CRC code by means of the second ECC code during the read operation. The CRC circuit generates a read CRC code corresponding to data corrected by the first ECC circuit during the read operation, and corrects a bit error of the data according to a comparison of the read CRC code and the write CRC code corrected by the second ECC circuit.

The CRC circuit includes a CRC engine receiving the data corrected by the first ECC circuit and generating the read CRC code, and a comparator generating the pass signal when the read CRC code matches the corrected write CRC code, and generating the fail signal when the read CRC code does not match the corrected write CRC code.

The memory device is a NAND flash memory device including a cell array divided into main and spare regions, wherein the data is programmed into the main region and the first and second ECC codes and the CRC code are programmed into the spare region. The first and second ECC circuits each detect two error bits and correct one error bit, and the CRC circuit detects more than two error bits.

According to an embodiment of the present invention, a method of detecting a bit error includes generating ECC and CRC codes corresponding to data to be stored in memory cells, storing the data in the memory cells, correcting a bit error for the data stored in the memory cells by means of the ECC code, generating a read CRC code corresponding to the data corrected with the bit error, and detecting a bit error of the data according to a comparison of the read CRC code and the write CRC code. Correcting the bit error includes treating the data as being failed when the number of error bits is over a correctable number of error bits. The method includes determining a failure of the data when the read CRC code does not match the write CRC code.

The memory device is a NAND flash memory device including a cell array divided into main and spare regions. The method further includes programming the data into the main region and programming the ECC and CRC codes into the spare region. Correcting the bit error includes detecting two error bits and correcting one error bit, and detecting the bit error of the data includes determining a bit error in a corrected bit error.

According to an embodiment of the present invention, a method for detecting a bit error in a memory device includes generating a write CRC code corresponding to data to be stored in memory cells, and generating a first ECC code corresponding to the data to be stored in the memory cells, and a second ECC code corresponding to the write CRC code. The method includes programming the data, the write CRC code, and the first and second ECC codes into the memory cells, correcting a bit error of the data by means of the first ECC code, and a bit error of the write CRC code by means of the second ECC code, generating a read CRC code corresponding to the data corrected with the bit error, and detecting a bit error of the data according to a comparison of the read CRC code and the write CRC code corrected with the bit error. Correcting the bit error includes treating the data as being failed when the number of error bits is over a correctable number of error bits.

The memory device is a NAND flash memory device including a cell array divided into main and spare regions, and the data is programmed into the main region and the first and second ECC codes and the CRC code are programmed into the spare region. Correcting the bit error includes detecting two error bits and correcting one error bit, and detecting the bit error of the data further includes determining a bit error in a corrected the bit error.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Figure 1:
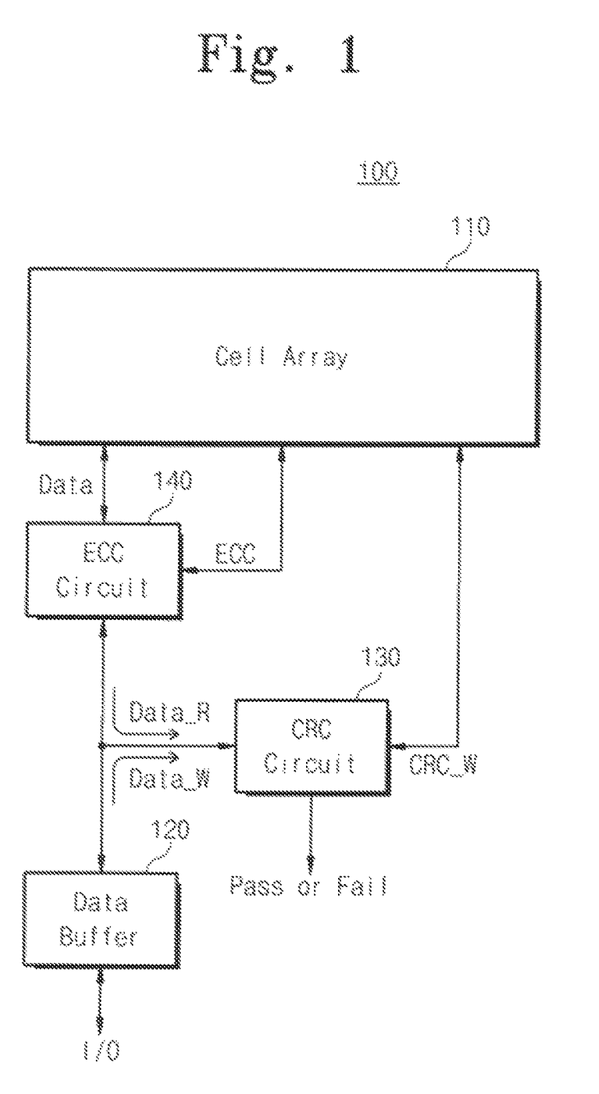
FIG. 1 is a block diagram illustrating a memory device in accordance with an embodiment of the invention.
Figure 2:
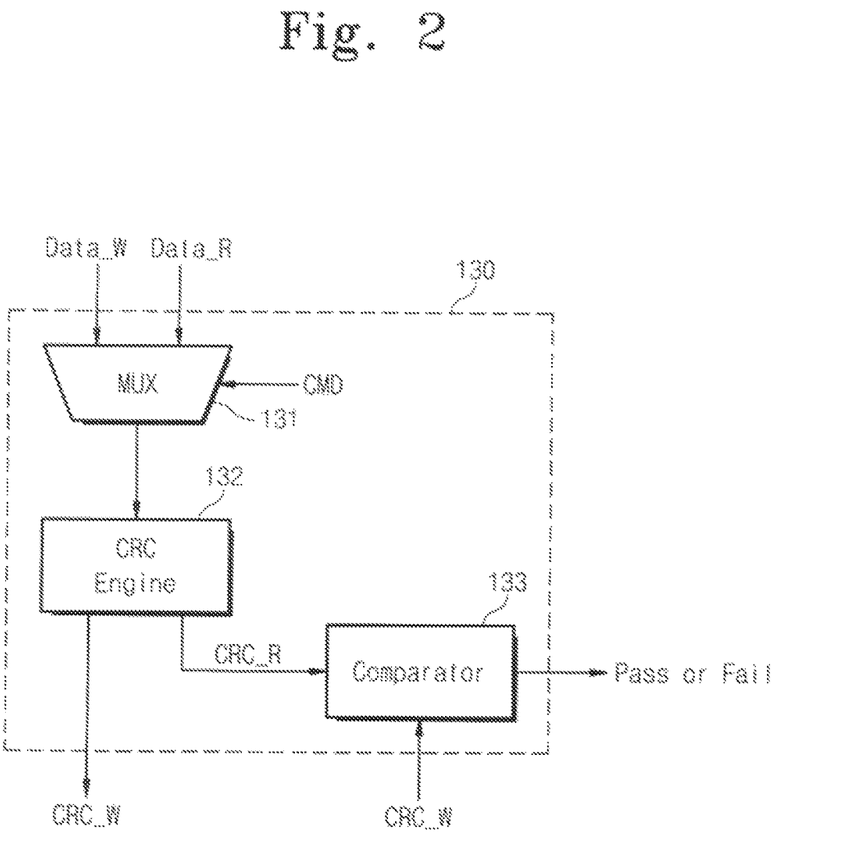
FIG. 2 is a block diagram illustrating a CRC circuit shown in FIG. 1.

FIG. 1 is a block diagram illustrating a memory device according to an embodiment of the present invention. FIG. 1 shows the memory device 100 and FIG. 2 shows a cyclic redundancy check (CRC) circuit 130 of the memory device 100. The memory device 100 is designed to correct a predetermined error bit (e.g., one error bit) and to detect pluralities of error bits (e.g., more than one error bit).

Referring to FIG. 1, the memory device 100 is comprised of a cell array 110, a data buffer 120, the CRC circuit 130, and an error correction code (ECC) circuit 140.

The cell array 110 stores data input by way of the data buffer 120. In the operational structure of the memory device, physical and architectural characteristics may cause bit errors on data stored in the cell array 110. For example, a bit error occurs when data is changed from '1' to '0' or from '0' to '1'. The ECC circuit 140 that is able to detect and correct bit errors (or error bits). The ECC circuit 140 can detect and correct single error bits and detect two error bits. The memory device 100 further comprises the CRC circuit 130 in addition to the ECC circuit 140 so as to increase the number of detectable error bits.

The CRC circuit 130 receives write data Data_W from the data buffer 120 during a write operation and receives read data Data_R from the ECC circuit 140. The CRC circuit 130 generates a write CRC code CRC_W from the write data Data_W. The CRC circuit 130 internally generates a read CRC code CRC_R (refer to FIG. 2) from the read data Data_R. The CRC circuit 130 compares the read CRC code CRC_R with the write CRC code CRC_W, from which a pass or fail signal is generated. The internal structure and operation of the CRC circuit 130 will be described in more detail with reference to FIG. 2.

The ECC circuit 140 receives the write data Data_W from the data buffer 120 during a write operation and receives the read data Read_R from the cell array 110 during the read operation. The ECC circuit 140 generates an ECC code ECC from the write data Data_W. The ECC circuit 140 provides the write data Data_W and the ECC code ECC to the cell array 110. During the read operation the ECC circuit 140 detects and corrects an error bit of the read data Data_R, which has been input from the cell array 110, by means of the ECC code ECC stored in the cell array.

The ECC circuit 140 may be implemented in various coding schemes such as Hamming code, BCH (Bose, Chaudhuri, Hocquenghem) code, or Reed-Solomon code. For example, an ECC circuit using Hamming codes with predetermined bits is able to detect a 2-bit error (i.e., two error bits) and to correct 1 1-bit error (i.e., one error bit). Namely, the ECC circuit with Hamming codes functions to detect and correct one error bit and to detect two error bits.

The memory device 100 uses the ECC circuit 140 to correct a 1-bit error (i.e., one error bit) and uses the CRC circuit 130 to detect a 3-bit error or greater (i.e., three or more error bits).

FIG. 2 is a block diagram illustrating the CRC circuit 130 shown in FIG. 1. Referring to FIG. 2, the CRC circuit 130 is comprised of a selection circuit 131, a CRC engine 132, and a comparator 133. The CRC circuit 130 receives the write data Data_W during the write operation, and generates the write CRC code CRC_W to the cell array. The CRC circuit 130 receives the read data Data_R during the read operation, and internally generates the read CRC code CRC_R. The CRC circuit 130 generates the pass or fail signal in accordance with a result of comparing the write CRC code CRC_W from the cell array with the read CRC code CRC_R.

The selection circuit 131 alternatively outputs one of the write data Data_W and the read data Data_R in response to a command CMD. The command may be a write command or a read command. The selection circuit 131 outputs the write data Data_W in response to the write command and outputs the read data Data_R in response to the read command. The read data Data_R is data corrected by the ECC circuit 140.

The CRC engine 132 receives the write data Data_W and outputs the write CRC code CRC_W to the cell array. The CRC engine 132 receives the read data Data_R and outputs the read CRC code CRC_R. The CRC engine may be utilized for verifying data reliability in the fields of data communication, data compression, data storage media (e.g., magnetic tapes, magnetic disc, and so forth), and the like. For example, with a 32-bit CRC engine, the probability that a bit error will be missed is than $2^{-32}$. The probability that the CRC engine won't detect a bit error is close to zero.

The comparator 133 compares the read CRC code CRC_R up with the write CRC code CRC_W. The comparator 133 generates the pass signal Pass when the read CRC code CRC_R matches the write CRC code CRC_W, or generates the fail signal Fail when the read CRC code CRC_R mismatches the write CRC code CRC_W.

Returning to FIG. 1, the memory device 100 according to an embodiment of the present invention employs the CRC circuit 130 to detect error bits that have not been discovered by the ECC circuit 140. The CRC circuit 130 may detect error bits that have not been detected by the ECC circuit 140, as well as correct a predetermined bit error (i.e., one error bit) by the ECC circuit 140. As a result, the memory device 100 achieves higher reliability for bit error than may be achieved by using the ECC circuit 140 alone.

Figure 3:
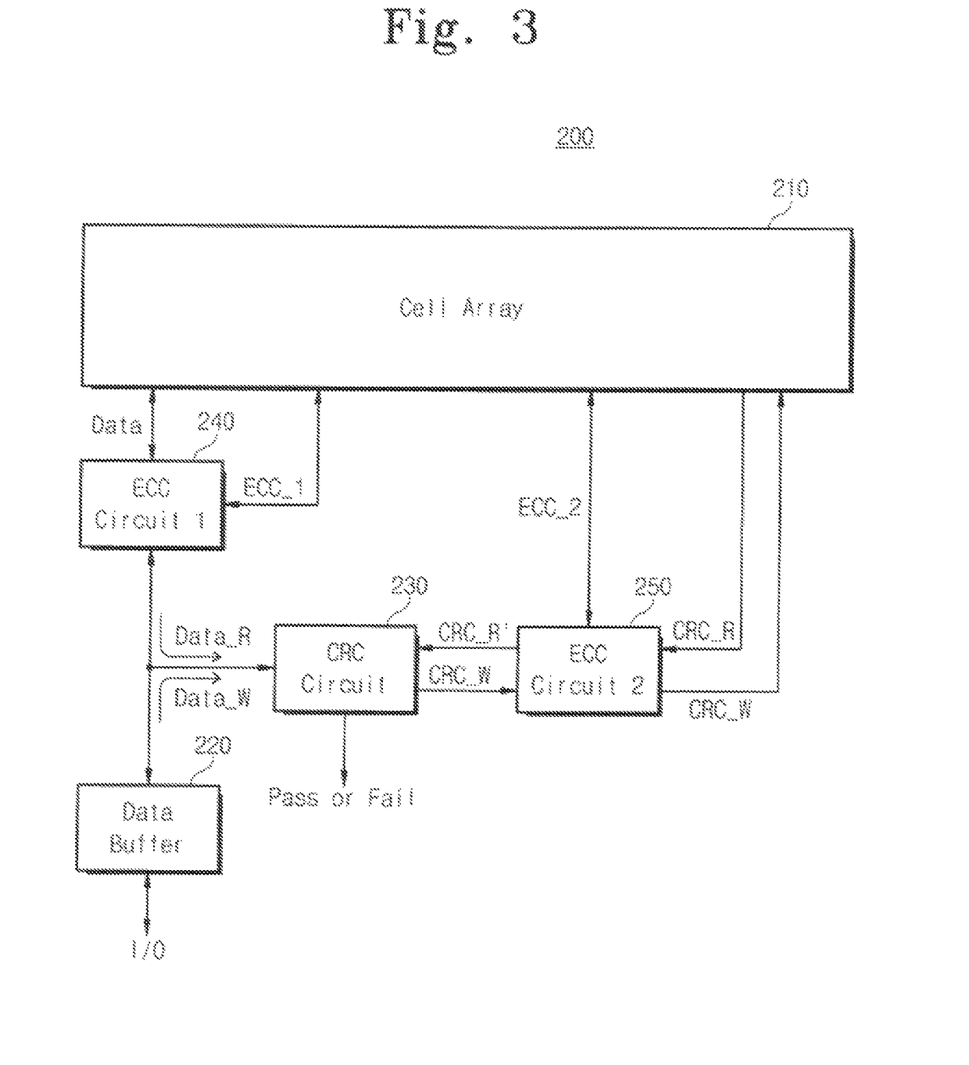
FIG. 3 is a block diagram illustrating a memory device in accordance with an embodiment of the present invention.

FIG. 3 is a block diagram illustrating a memory device in accordance with an embodiment of the present invention. Referring to FIG. 3, the memory device 200 shown in FIG. 3 further includes an additional ECC circuit, e.g., a second ECC circuit 250, relative to the memory device 100 of FIG. 1. In FIG. 3, a CRC circuit 230 and a first ECC circuit 240 operate substantially the same as the CRC and ECC circuits 130 and 140 of FIG. 1.

The second ECC circuit 250 detects error bits that are generated from the write CRC code CRC_W in the memory device 200. The memory device 200 achieves higher reliability for bit error as compared to the memory device 100 shown in FIG. 1.

The second ECC circuit 250 receives the write CRC code CRC_W from the CRC circuit 230 during the write operation, and receives the read CRC code CRC_R from the cell array 110 during the read operation. The second ECC circuit 250 generates a second ECC code ECC_2 from the write CRC code CRC_W. The ECC code generated from the first ECC circuit 240 is referred to as the first ECC code ECC_1. The second ECC circuit 250 provides the cell array 210 with the write CRC code CRC_W and the second ECC code ECC_2.

The second ECC circuit 250 detects and corrects an error bit of the read CRC code CRC_R, which is input from the cell array 210, by means of the second ECC code ECC_2 stored in the cell array 210. The second ECC circuit 250 corrects the error bit of the read CRC code CRC_R and thereafter provides a corrected read CRC code CRC_R' to the CRC circuit 230.

The CRC circuit 230 internally generates a read CRC code CRC_R" from the read data Data_R. The CRC circuit 230 compares the internally generated read CRC code CRC_R" with the corrected read CRC code CRC_R', and generates the pass or fail signal.

Referring to FIG. 3, the memory device 200 includes the second ECC circuit 250 to correct a bit error of the CRC code generated by the CRC circuit 230. Thus, the memory device 200 increases the reliability of correcting bit errors as compared to the memory device 100 shown in FIG. 1.

Figure 4A:
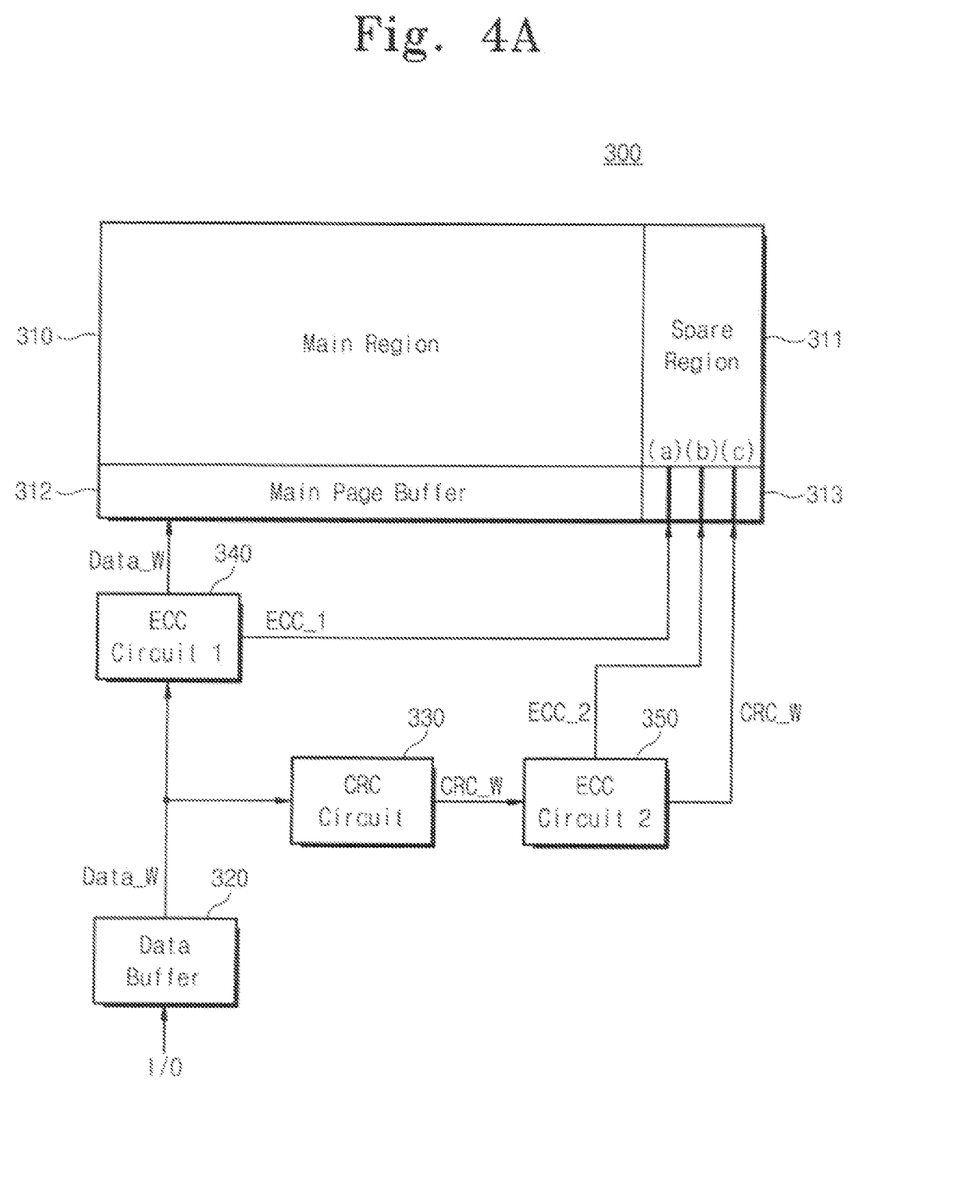
FIG. 4A is a block diagram illustrating a NAND flash memory device in accordance with an embodiment of the present invention.
Figure 4B:
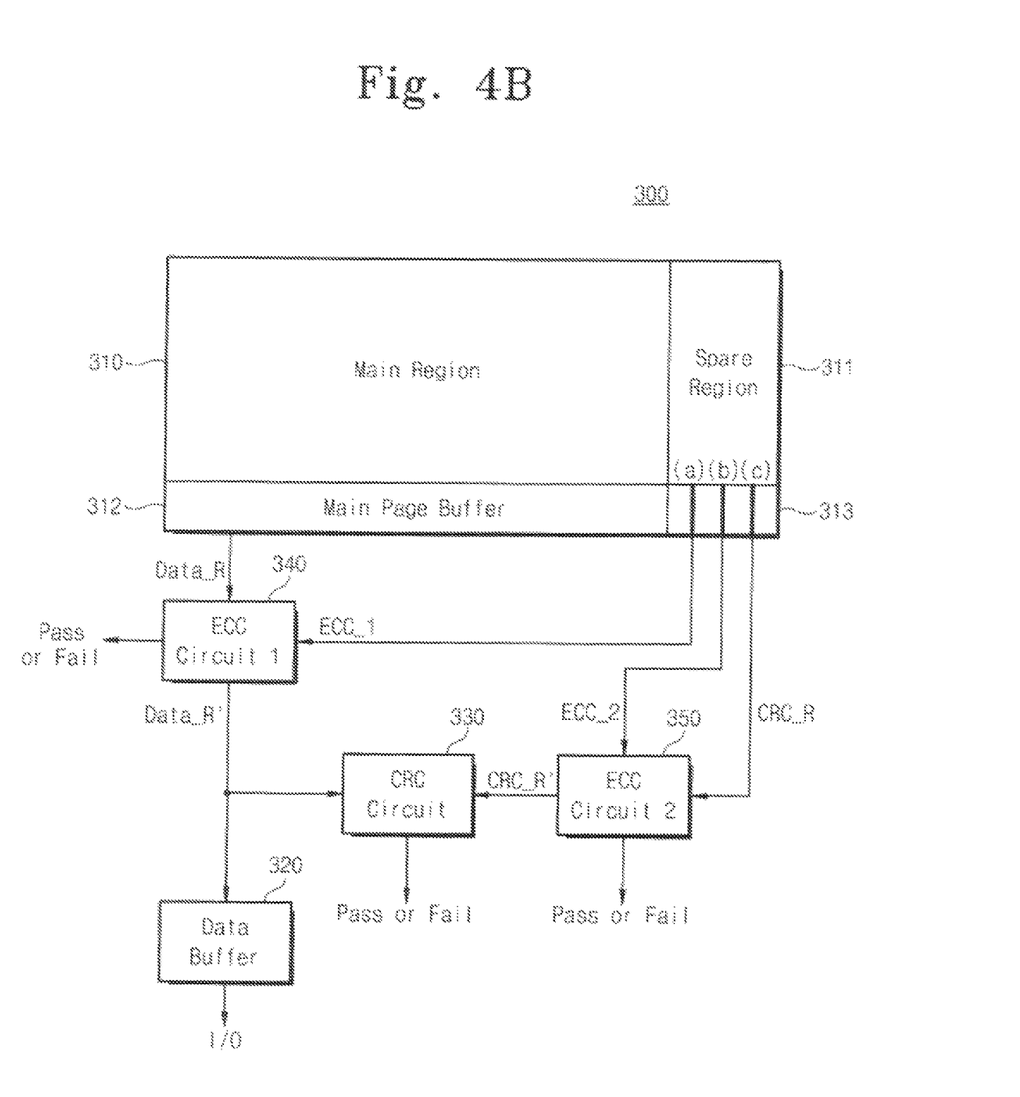
FIG. 4B is a block diagram showing the feature of a read operation in the device shown by FIG. 4A.
Figure 5:
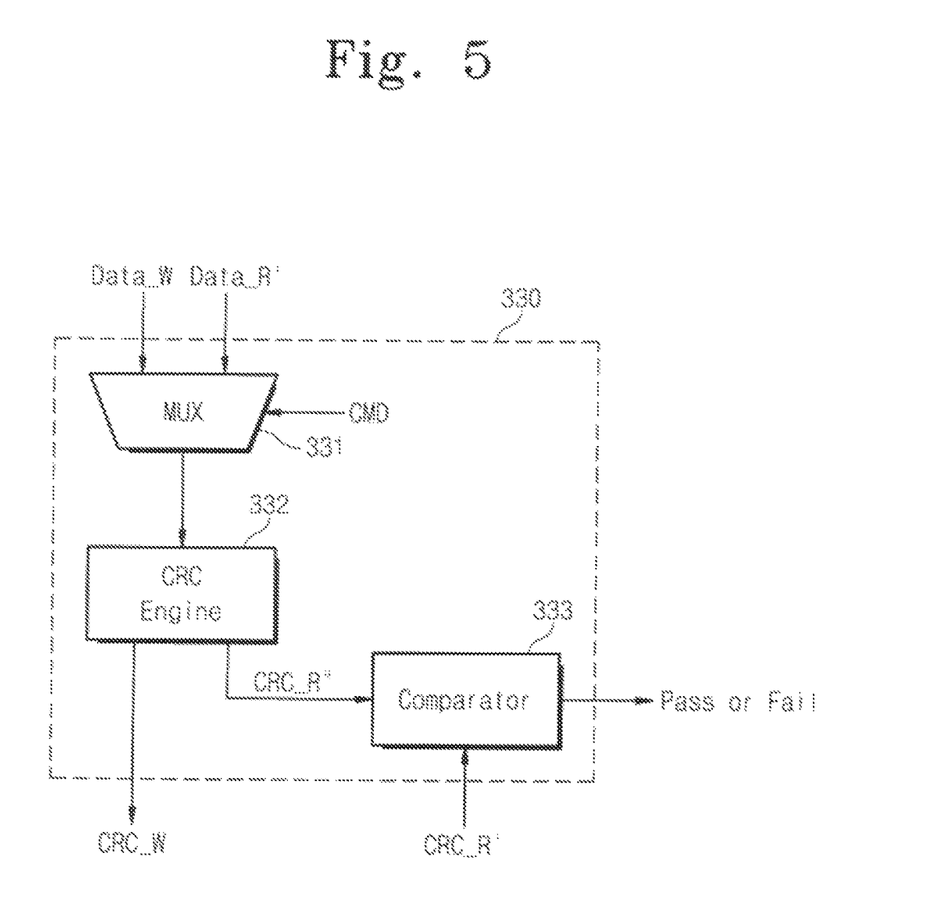
FIG. 5 is a block diagram illustrating the CRC circuit shown in FIGS. 4B and 4B.
Figure 6:
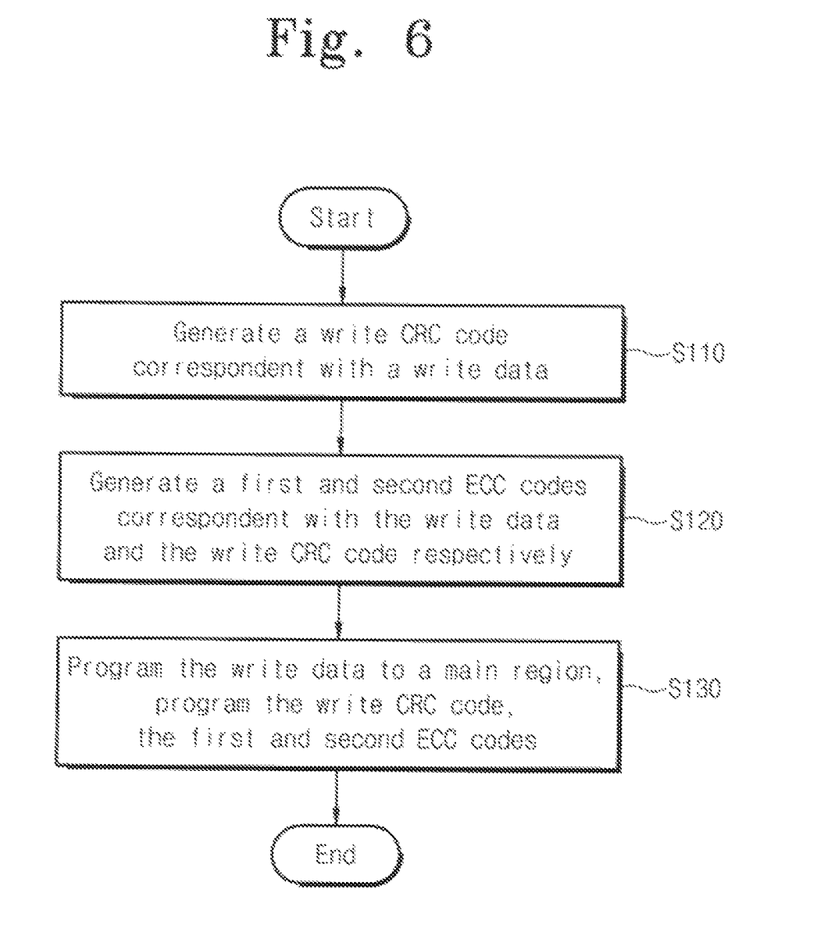
FIG. 6 is a flow chart showing a write operation of the NAND flash memory device shown in FIG. 4A.
Figure 7:
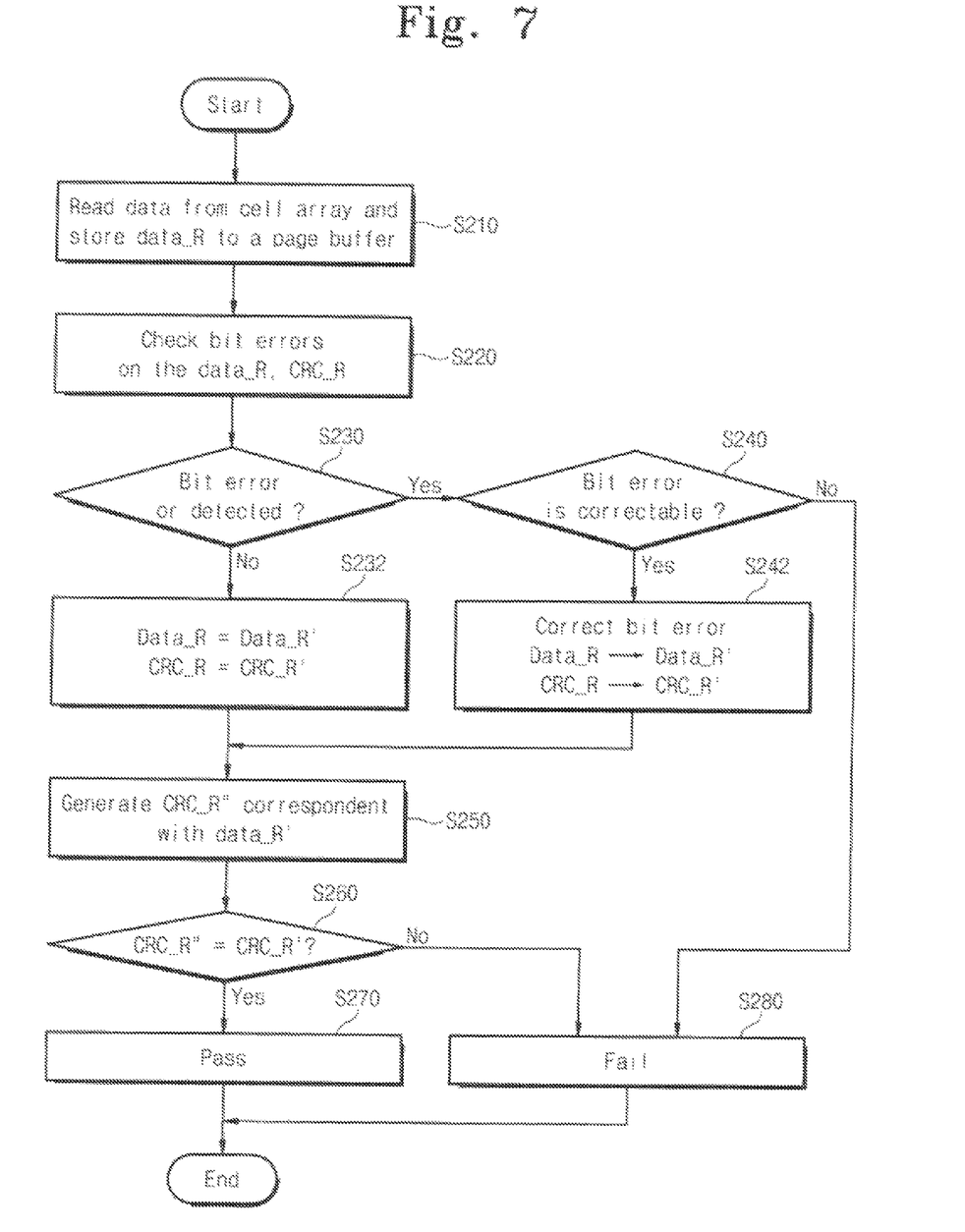
FIG. 7 is a flow chart showing the read operation of the NAND flash memory device as shown in FIG. 4B.

FIGS. 4A through 7 show features of a memory device 300 according to an embodiment of the present invention. The memory device 300 is a NAND flash memory device. FIG. 4A illustrates a data flow during a write operation. FIG. 4B illustrates a data flow during a read operation. FIG. 5 illustrates an internal structure of the CRC circuit 330 shown in FIGS. 4A and 4B. FIGS. 6 and 7 are flow charts showing the write and read operations, respectively.

Referring to FIGS. 4A and 4B, the NAND flash memory device 300 according to an embodiment of the present invention includes a cell array composed of main and spare regions 310 and 311, and page buffers 312 and 313, a data buffer 320, a CRC circuit 330, a first ECC circuit 340, and a second ECC circuit 350.

The cell array of the NAND flash memory device 300 is divided into the main and spare regions 310 and 311. The page buffers are also divided into the main page buffer 312 corresponding to the main region 310 and the spare page buffer 313 corresponding to the spare region 311. Configurations and operations of the cell array and page buffers in the NAND flash memory device 300 are well known by those skilled in this art, and further descriptions are omitted.

Referring to FIG. 4A, the CRC circuit 330 receives the write data Data_W and generates the write CRC code CRC_W. The first ECC circuit 340 receives the write data Data_W and generates the first ECC code ECC_1. The second ECC circuit 350 receives the write data Data_W and generates the second ECC code ECC_2. The write data Data_W are stored in the main page buffer 312. The first ECC code ECC_1, the second ECC code ECC_2, and the write CRC code CRC_W are stored in fields (a), (b), and (c) of the spare page buffer 313. The write data Data_W stored in the main page buffer 312 are programmed into the main region 310. The first ECC code ECC_1, the second ECC code ECC_2, and the write CRC code CRC_W, which are stored in the spare page buffer 313, are programmed into the spare region 311.

Referring to FIG. 4B, the first ECC circuit 340 detects and corrects a bit error of the read data Data_R by means of the first ECC code ECC_1. The first ECC circuit 340 detects and corrects one error bit (i.e., a 1-bit error). If more than two error bits are detected, the first ECC circuit 340 generates the fail signal Fail. The second ECC circuit 350 detects and corrects a bit error of the read CRC code CRC_R by means of the second ECC code ECC_2. The second ECC circuit 350 corrects the bit error when the bit error is detected. If more than two error bits are detected, the second ECC circuit 350 generates the fail signal Fail.

Referring to FIG. 5, the CRC circuit 330 receives the corrected read data Data_R' from the first ECC circuit 340, and internally generates the read CRC code CRC_R". The CRC circuit 330 compares the internal read CRC code CRC_R" with the corrected read CRC code CRC_R' that is generated by the second ECC circuit 350. The CRC circuit 330 generates the fail signal Fail when the two codes are different from one another.

FIG. 6 is a flow chart showing the write operation of the NAND flash memory device as shown in FIG. 4A.

At block S110, the write CRC code CRC_W is generated corresponding to the write data Data_W. Referring to FIG. 4A, the CRC circuit 330 receives the write data Data_W from the data buffer 320, and generates the write CRC code CRC_W.

At block S120, the ECC codes ECC_1 and ECC_2 are generated corresponding to the write data Data_W and the write CRC code CRC_W, respectively. Referring to FIG. 4A, the first ECC circuit 340 receives the write data Data_W and generates the first ECC code ECC_1 for the write data code Data_W. The second ECC circuit 350 receives the write CRC code CRC_W and generates the second ECC code ECC_2 for the write data code Data_W.

At block S130, the main region 310 is programmed with the write data Data_W, and the spare region 311 is programmed with the first ECC code ECC_1, the second ECC code ECC_2, and the write CRC code CRC_W.

FIG. 7 is a flow chart showing the read operation of the NAND flash memory device as shown in FIG. 4B.

At block S120, data read out from the cell array is stored in the page buffer. The data stored in the page buffer is programmed in the cell array during the write operation. Referring to FIG. 4B, the read data Data_R from the main region 310 is stored in the main page buffer 312. The first ECC code ECC_1, the second ECC code ECC_2, and the read CRC code CRC_R, which are read out from the spare region 311, are stored in the spare page buffer 313.

At block S220 checks are performed for bit errors on the read data Data_R of the main page buffer 312 and the read CRC code CRC_R of the spare page buffer 313. Referring to FIG. 4B, the first ECC circuit 340 detects a bit error on the read data Data_R by means of the first ECC code ECC_1. The second ECC circuit 350 detects a bit error on the read CRC code CRC_R by means of the second ECC code ECC_2.

At block S230, a bit error (or an error bit) is detected from the read data Data_R and the read CRC code CRC_R. If there is a bit error, the procedure goes to block S240. Unless there is a bit error, the procedure moves to block S232.

Block S232 is carried out when there is no bit error, the first ECC circuit 340 directly outputs the read data Data_R, wherein, Data_R=Data_R'. The second ECC circuit 350 directly outputs the read CRC code CRC_R wherein, CRC_R=CRC_R'.

At block S240 the bit error is corrected. It is assumed that the first and second ECC circuits 340 and 350 are designed to correct a 1-bit error. If more than two error bits are detected at block S230, the first and second ECC circuits 340 and 350 may not correct the error bits. Where three or more error bits are detected, the procedure goes to block S280. At block S280, the read data is treated as being failed. Otherwise, if one error bit is detected at block S230, the error bit (i.e., the 1-error) is corrected therein. The procedure moves to block S242.

At block S242, the detected error bit is corrected. Referring to FIG. 4B, the first ECC circuit 340 corrects the bit error of the read data Data_R and outputs the corrected read data Data_R'. The second ECC circuit 350 corrects the bit error of the read CRC code CRC_R and outputs the corrected read CRC code CRC_R'.

At block S250, the read CRC code CRC_R" is generated in correspondence with the corrected read data Data_R'. Referring to FIGS. 4B and 5, the CRC circuit 330 receives the corrected read data Data_R' and internally generates the read CRC code CRC_R".

At block S260, the internal read CRC code CRC_R" is compared to the corrected read CRC code CRC_R'. Referring to FIG. 5, the comparator 333 compares the internal read CRC code CRC_R" with the corrected read CRC code CRC_R' provided by the second ECC 350. The comparator 333 generates the pass signal Pass when CRC_R' matches CRC_R" (block S270), and generates the fail signal Fail when CRC_R' does not match CRC_R" (block S280).

Referring to FIGS. 4A through 7, the NAND flash memory device 300 according to an embodiment of the present invention corrects a bit error of data by means of the first ECC circuit 340, detects a bit error, which has not been detected by the first ECC circuit 340, by means of the CRC circuit 330, and corrects a bit error of the CRC code by means of the second ECC circuit 350.

The NAND flash memory device 300 programs the CRC code along with data, without programming an additional confirm mark or flag. The write operation need only be performed once, wherein the CRC code functions as the confirm mark.

As described above, the memory device and bit error correction method according to an embodiment of the present invention detects a bit error, which has not been detected by the ECC circuit, by means of the CRC circuit, and corrects a predetermined bit error (e.g., a 1-bit error) by means of the ECC circuit.

Various exemplary applications of the memory device (100 of FIG. 1) according to the present invention will now be illustrated below.

Figure 8:
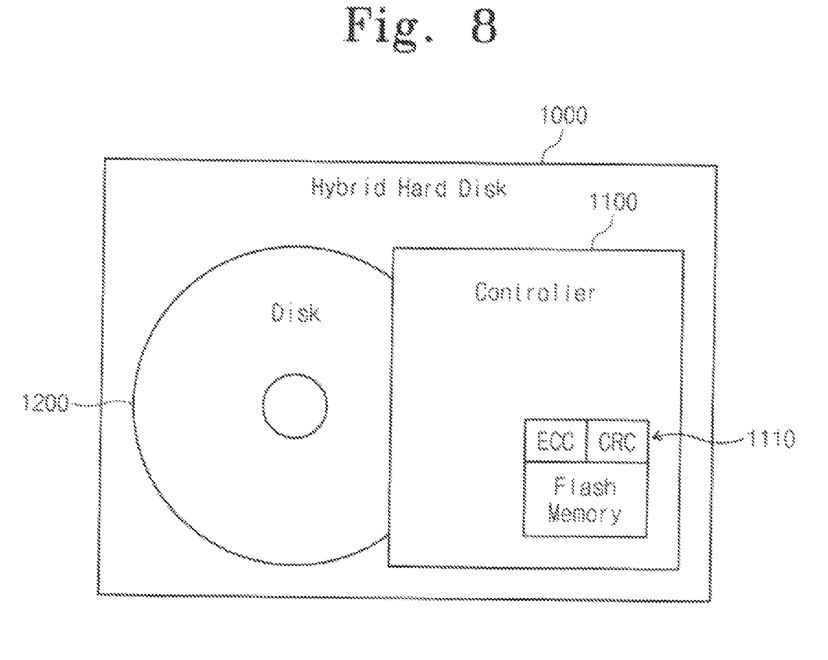
FIGS. 8-9 illustrate exemplary memory devices applied to a hybrid hard disk in accordance with embodiments of the present invention.

FIG. 8 illustrates an example where the memory device according to the present invention is applied to a hybrid hard disk 1000. As illustrated in FIG. 8, the hybrid hard disk 1000 includes a controller 1100 and a disk 1200. The controller 1100 includes a memory device 1110 according to an exemplary embodiment of the present invention. The memory device 1110 includes a flash memory, an ECC circuit, and a CRC circuit.

Figure 9:
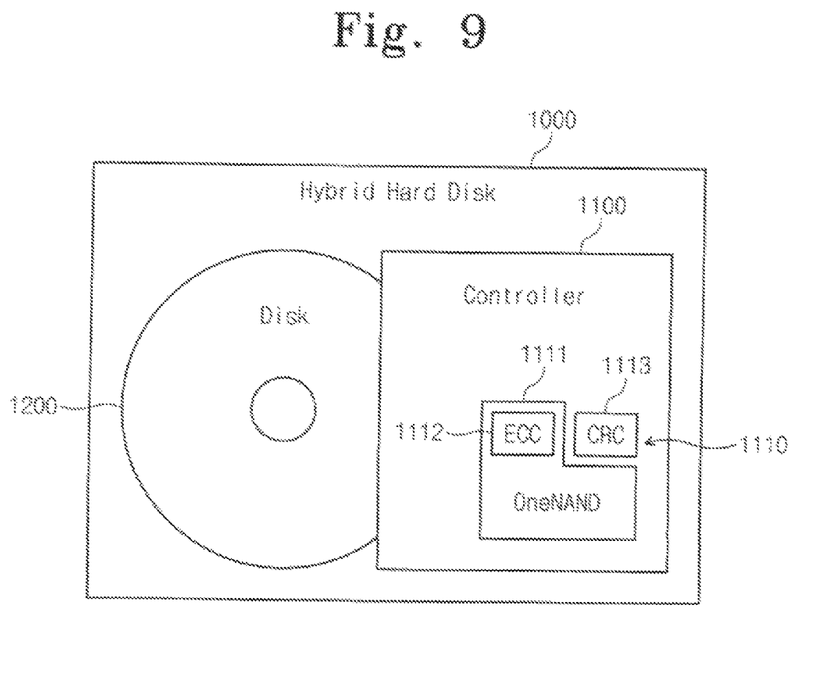

The flash memory and the ECC circuit may be merged into one memory device such as, for example, OneNAND. Referring to FIG. 9, the memory device 1110 includes OneNAND 1111 and a CRC circuit 1113. And the OneNAND 1111 includes an ECC circuit 1112. The operation principle of the memory devices 1100 of FIGS. 8 and 9 are substantially identical to the foregoing.

Figure 10:
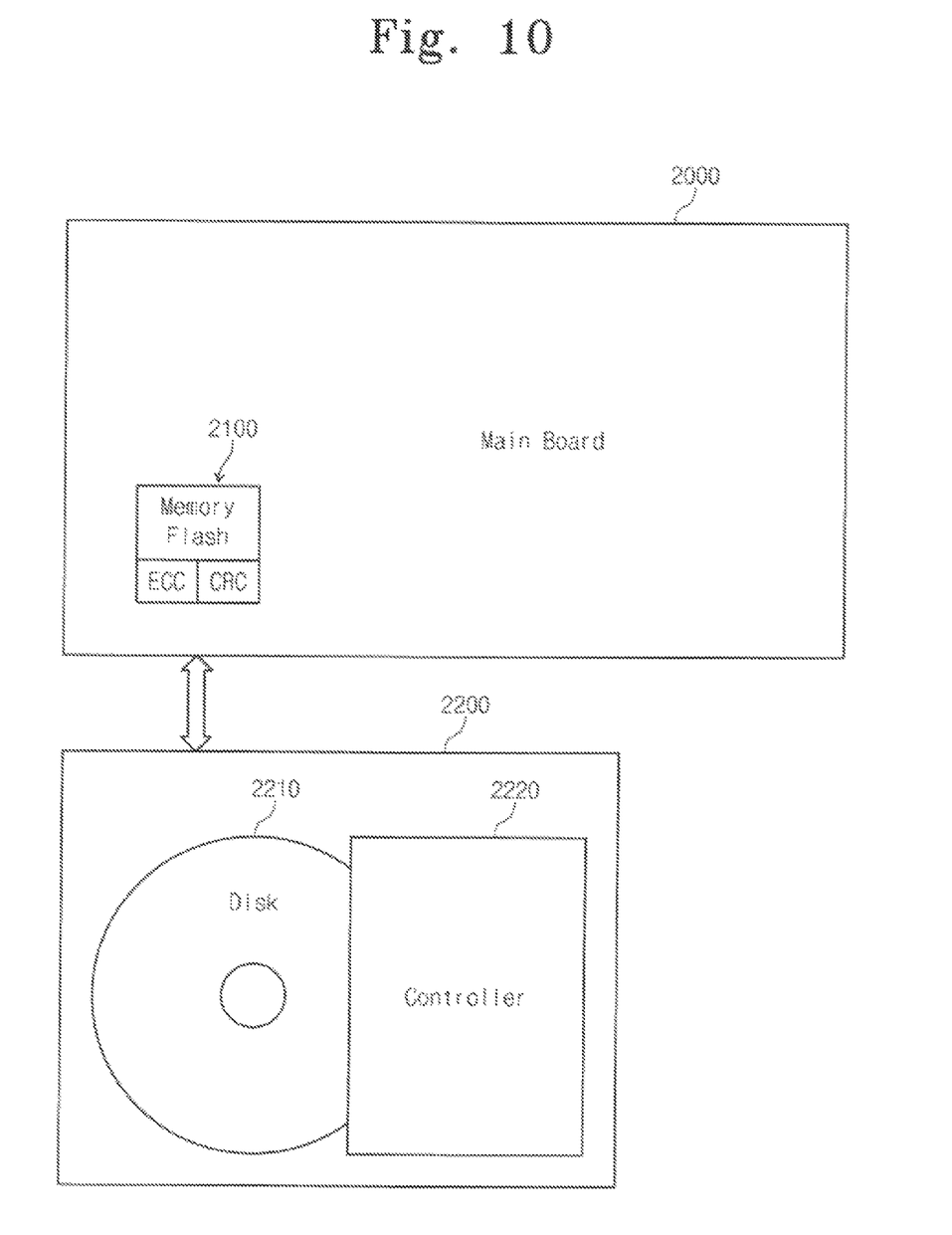
FIGS. 10-11 illustrates exemplary applications where a memory device is applied to a main board according to embodiments of the present invention.

FIG. 10 illustrates an exemplary application where a memory device according to an embodiment of the present invention to a main board 2000. As illustrated in FIG. 10, an external hard disk 2200 is connected to the main board 2000. The external hard disk 2200 includes a disk 2210 and a controller 2220. Besides the external hard disk 2200, additional modules may be connected to the main board 2000. For example, FIG. 10 illustrates a flash module 2100 memory device according to an embodiment the present invention connected to the main board 2000. The flash module 2100 includes a flash memory, an ECC circuit, and a CRC circuit.

Figure 11:
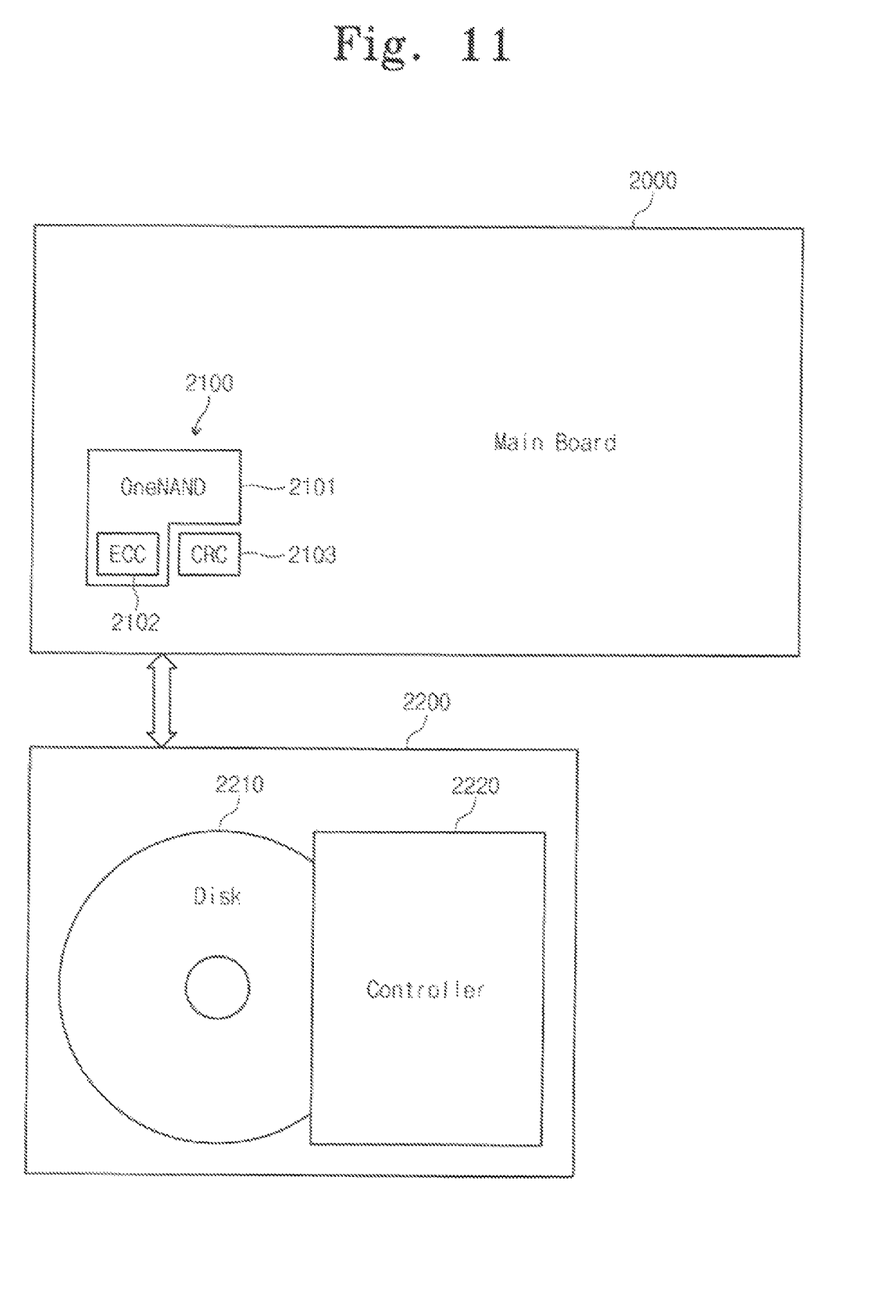

The flash memory and the ECC circuit may be merged into one memory device such as, for example, OneNAND. Referring to FIG. 11, the flash module 2100 includes OneNAND 2101 and a CRC circuit 2103. The OneNAND 2101 includes an ECC circuit 2102. The operation principle of the flash modules 2100 are substantially identical to the foregoing.

Figure 12:
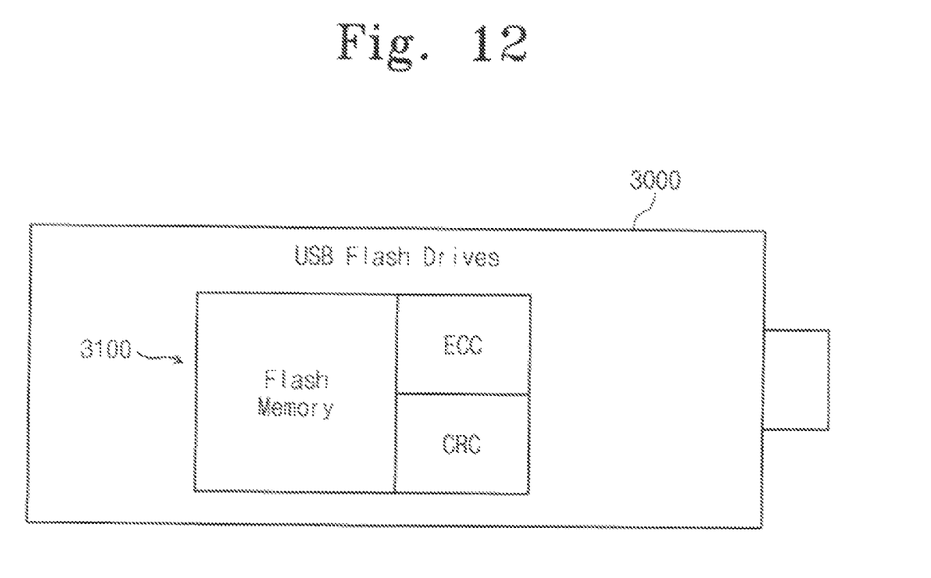
FIGS. 12-13 illustrates exemplary applications where a memory device is applied to a USB flash drive according to embodiments of the present invention.

FIG. 12 illustrates an exemplary application where a memory device according to an embodiment of the present invention is applied to a USB flash drive 3000. As illustrated in FIG. 12, the USB flash drive 3000 includes a memory device 3100 according to an embodiment of the present invention. The memory device 3100 includes a flash memory, an ECC circuit, and a CRC circuit.

Figure 13:
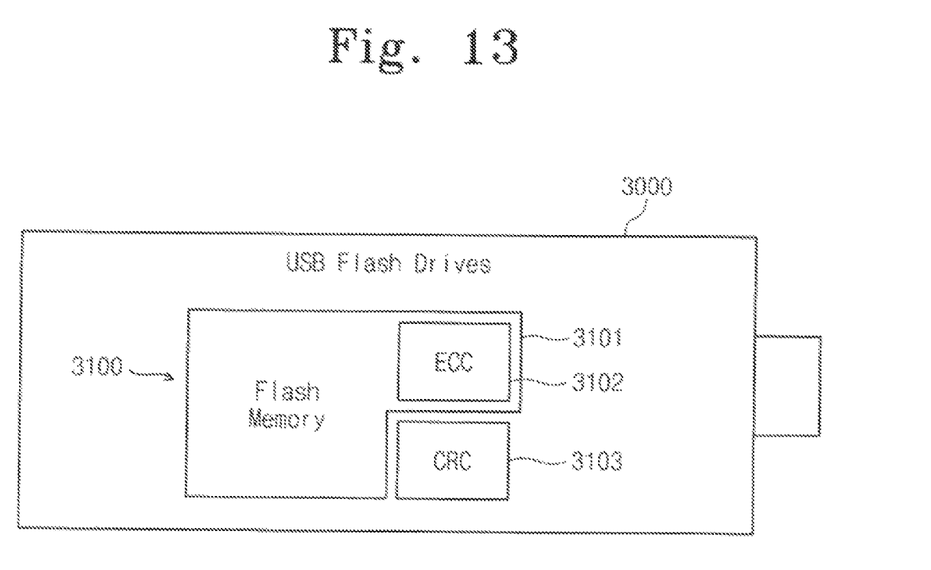

The flash memory and the ECC circuit may be merged into one memory device such as, for example, OneNAND. Referring to FIG. 13, the memory device 3100 includes OneNAND 3101 and a CRC circuit 3103. The OneNAND 3100 includes an ECC circuit 3102. The operation principle of the memory devices 3100 of FIGS. 12 and 13 are substantially identical to the foregoing.

Figure 14:
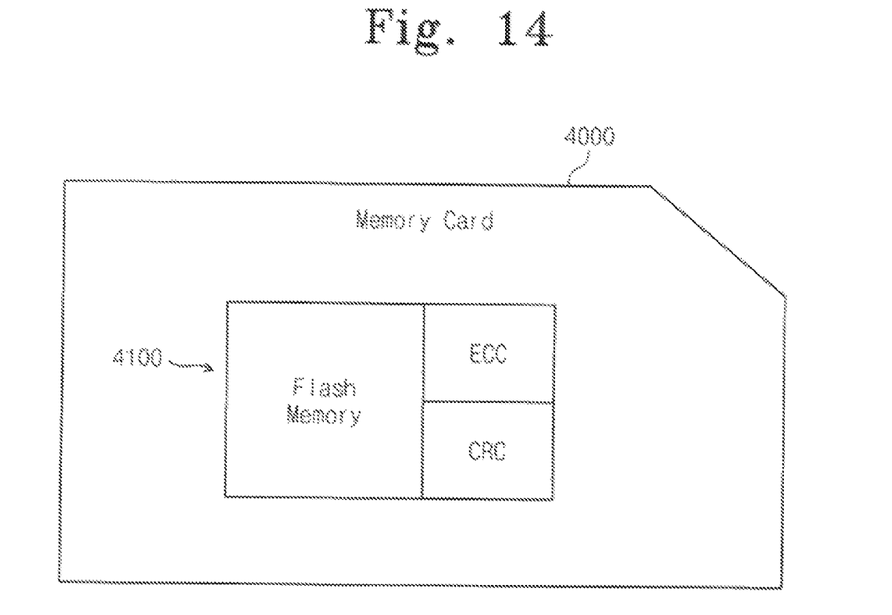
FIGS. 14-15 illustrates exemplary embodiments where a memory device is applied to a memory card in accordance with embodiments of the present invention.

FIG. 14 illustrates an exemplary embodiment where a memory device according to an embodiment of the present invention is applied to a memory card 4000. The memory card 4000 is, for example, an SD card, and xD card, an MMC card, or a CF card. As illustrated in FIG. 14, the memory card 4000 includes a memory device 4100. The memory device 4100 includes a flash memory, an ECC circuit, and a CRC circuit.

Figure 15:
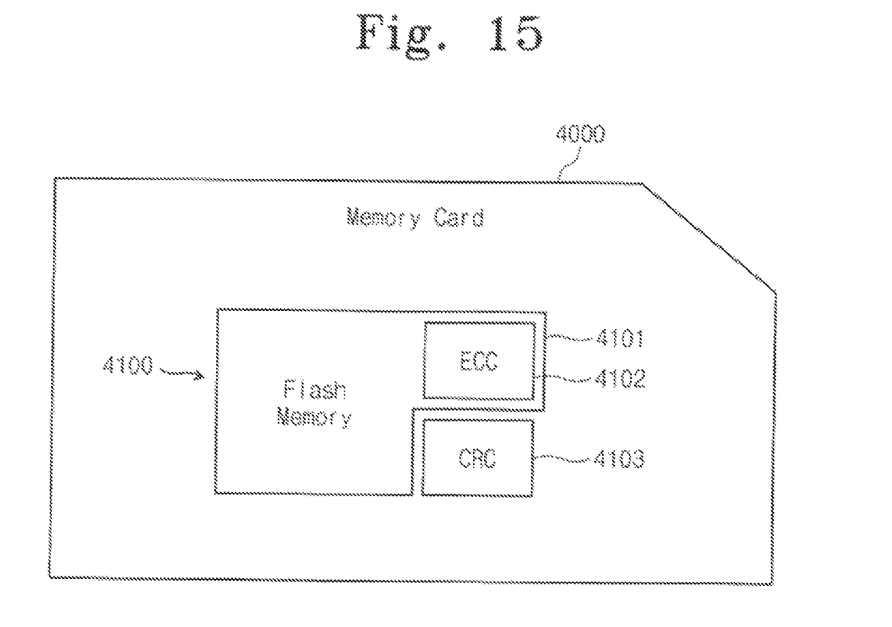

The flash memory and the ECC circuit may be merged into one memory device such as, for example, OneNAND. Referring to FIG. 15, the memory device 4100 includes OneNAND 4101 and a CRC circuit 4103. The OneNAND 4101 includes an ECC circuit 4102. The operation principles of the memory devices 4100 of FIGS. 14 and 15 are substantially identical to the foregoing.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A memory device comprising:
    a cyclic redundancy check (CRC) circuit generating a write CRC code corresponding to data to be stored in memory cells; and
    an error correction code (ECC) circuit generating an ECC code corresponding to the data and detecting and correcting an error of the data by means of the ECC code during a read operation,
    wherein the CRC circuit generates a read CRC code corresponding to data corrected by the ECC circuit during the read operation, and detects an error of the data not corrected by the ECC circuit according to a comparison of the read CRC code and the write CRC code.

2. The memory device as set forth in claim 1, wherein the CRC circuit generates a pass signal when the read CRC code matches the write CRC code and generates a fail signal when the read CRC code does not match the write CRC code.

3. The memory device as set forth in claim 1, wherein the CRC circuit comprises:
    a CRC engine receiving the data corrected by the ECC circuit and generating the read CRC code; and
    a comparator generating the pass signal when the read CRC code matches with the write CRC code, and generating the fail signal when the read CRC code does not match the write CRC code.

4. The memory device as set forth in claim 1, wherein the memory device is a NAND flash memory device comprising a cell array divided into main and spare regions, and
    wherein the data is programmed into the main region and the ECC and CRC codes are programmed into the spare region.

5. The memory device as set forth in claim 4, wherein the ECC circuit detects two error bits and corrects one error bit, and
    wherein the CRC circuit detects more than two error bits.

6. A memory device comprising:
    a cyclic redundancy check (CRC) circuit generating a write CRC code corresponding to data to be stored in memory cells;
    a first error correction code (ECC) circuit generating a first ECC code corresponding to the data and detecting and correcting an error of the data by means of the first ECC code during a read operation; and
    a second ECC circuit generating a second ECC code corresponding to the write CRC code and detecting and correcting an error of the write CRC code by means of the second ECC code during the read operation,
    wherein the CRC circuit generates a read CRC code corresponding to data corrected by the first ECC circuit during the read operation, and detects an error of the data not corrected by the ECC circuit according to a comparison of the read CRC code and the write CRC code corrected by the second ECC circuit.

7. The memory device as set forth in claim 6, wherein the CRC circuit generates a pass signal when the read CRC code matches the corrected write CRC code, and generates a fail signal when the read CRC code does not match the corrected write CRC code.

8. The memory device as set forth in claim 6, wherein the CRC circuit comprises:
    a CRC engine receiving the data corrected by the first ECC circuit and generating the read CRC code; and
    a comparator generating the pass signal when the read CRC code matches the corrected write CRC code, and generating the fail signal when the read CRC code does not match the corrected write CRC code.

9. The memory device as set forth in claim 6, wherein the memory device is a NAND flash memory device that has a cell array divided into main and spare regions, and
    wherein the data is programmed into the main region and the first and second ECC codes and the CRC code are programmed into the spare region.

10. The memory device as set forth in claim 9, wherein the first and second ECC circuits each detect two error bits and correct one error bit, and
    wherein the CRC circuit detects more than two error bits.

11. The memory device as set forth in claim 9, wherein the data, the first and second ECC codes, and the CRC code are programmed substantially simultaneously.

12. A method of detecting an error in a memory device, comprising:
    generating, by an ECC circuit, error correction code (ECC) and cyclic redundancy check (CRC) codes corresponding to data to be stored in memory cells;
    storing the data in the memory cells;
    generating corrected data by correcting an error for the data stored in the memory cells by utilizing the ECC code;
    generating, by a CRC circuit, a read CRC code corresponding to the corrected data; and
    detecting an error of the corrected data not corrected by the ECC circuit according to a comparison of the read CRC code to the write CRC code.

13. The method as set forth in claim 12, wherein correcting the error comprises treating the data as being failed when the number of error bits is over a correctable number of error bits.

14. The method as set forth in claim 12, further comprising determining a failure of the data when the read CRC code does not match the write CRC code.

15. The method as set forth in claim 12, wherein the memory device is a NAND flash memory device comprising a cell array divided into main and spare regions,
    the method further comprising programming the data into the main region and programming the ECC and CRC codes into the spare region.

16. The method as set forth in claim 15, wherein correcting the error comprises detecting first and second error bits and correcting the first error bit, and
    wherein detecting the error of the corrected data comprises determining the second error bit in the corrected data.

17. A method of detecting an error in a memory device, comprising:
    generating, by a CRC circuit, a write cyclic redundancy check (CRC) code corresponding to data to be stored in memory cells;

generating, by a first ECC circuit, a first error correction code (ECC) code corresponding to the data to be stored in the memory cells, and a second ECC code, by a second ECC circuit, corresponding to the write CRC code;

programming the data, the write CRC code, and the first and second ECC codes into the memory cells;

generating corrected data by correcting an error of the data by means of the first ECC code generating corrected write CRC code by correcting an error of the write CRC code by means of the second ECC code;

generating a read CRC code corresponding to the corrected data; and detecting, by the CRC circuit, an error of the corrected data not corrected by the ECC circuits according to a comparison of the read CRC code and the corrected write CRC code.

18. The method as set forth in claim 17, wherein correcting the error of the data by means of the first ECC code further comprises treating the data as being failed when the number of error bits is over a correctable number of error bits.

19. The method as set forth in claim 17, wherein the memory device is a NAND flash memory device comprising a cell array divided into main and spare regions, and the method further comprising programmed the data into the main region, and the first ECC codes, the second ECC codes, and the CRC code are programmed into the spare region.

20. The method as set forth in claim 19, wherein correcting the error of the data by means of the first ECC code comprises detecting first and second error bits and correcting the first error bit, and wherein detecting, by the CRC circuit, the error of the corrected data further comprises determining the second error bit in the corrected data.

* * * * *